(12) United States Patent
Kai

(10) Patent No.: US 6,233,188 B1
(45) Date of Patent: May 15, 2001

(54) PRECHARGE CONTROL SIGNAL GENERATING CIRCUIT

(75) Inventor: Yasukazu Kai, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/617,121

(22) Filed: Jul. 14, 2000

(30) Foreign Application Priority Data

Jul. 29, 1999 (JP) ................................................... 11-214537

(51) Int. Cl.[7] ....................................................... G11C 7/00
(52) U.S. Cl. ................ 365/203; 365/189.09; 365/189.11
(58) Field of Search .............................. 365/203, 189.09, 365/189.11, 230.06, 189.01

(56) References Cited

U.S. PATENT DOCUMENTS 5,606,524 * 2/1997 Ozaki et al. ..................... 365/185.23
5,933,373 * 8/1999 Takahashi ....................... 365/189.06

* cited by examiner

Primary Examiner—David Nelms
Assistant Examiner—Gene N. Auduong
(74) Attorney, Agent, or Firm—Venable; Robert J. Frank; Allen Wood

(57) ABSTRACT

A level shifter K1 receives a part of a precharge generation signal Sp, raises its level to a predetermined value, and transfers it to an NMOS transistor NT1. A capacitor Cp receives a part of the output of the level shifter K1, supplies it to a first electrode of a complementary amplifier composed of a PMOS transistor PT1 and an NMOS transistor NT2, and pumps an operation power source to a predetermined value. The operation power source of the complementary amplifier is pumped by an electric charge charged in the capacitor Cp, and the level of a precharge control signal Spc is raised.

4 Claims, 14 Drawing Sheets

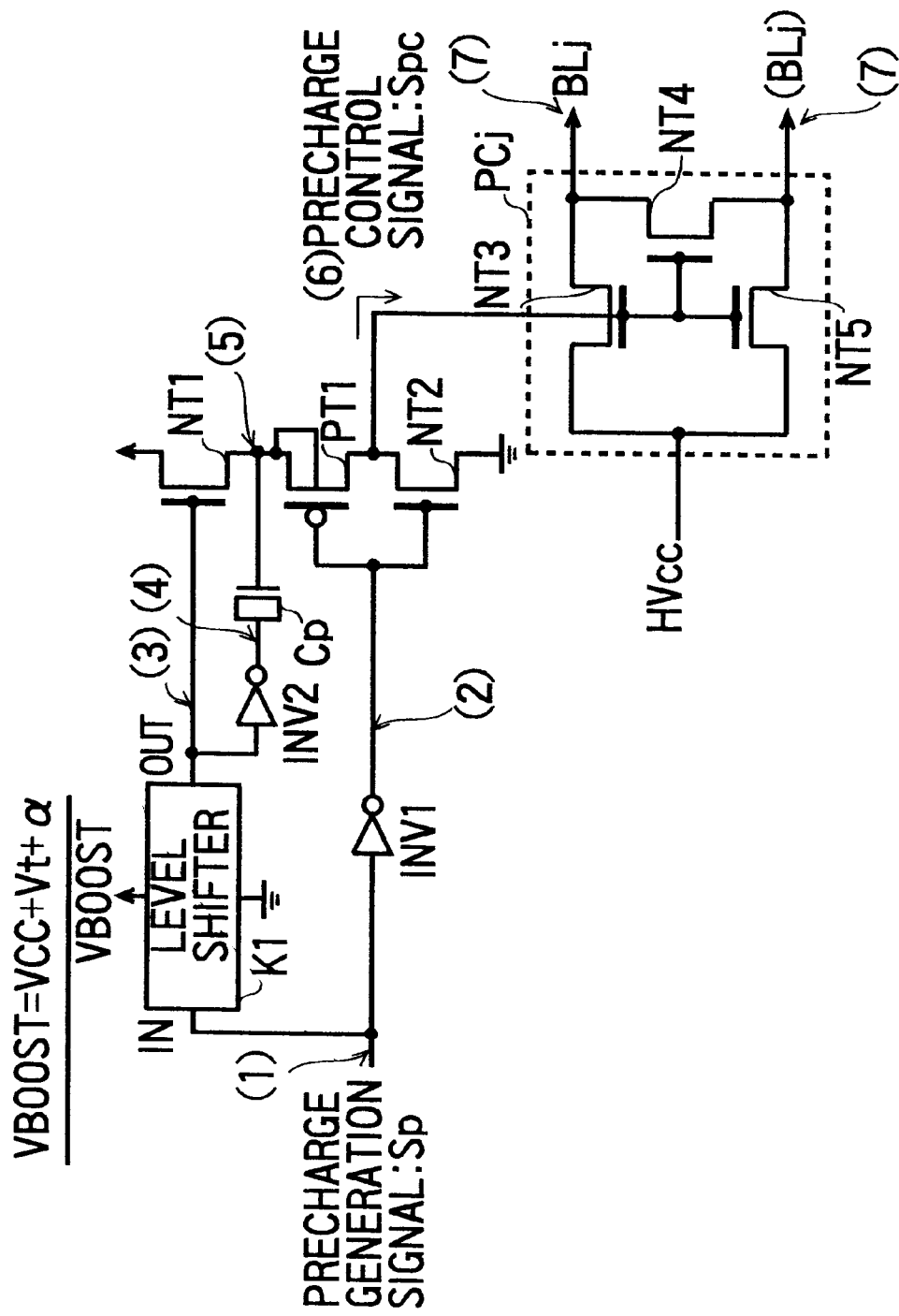

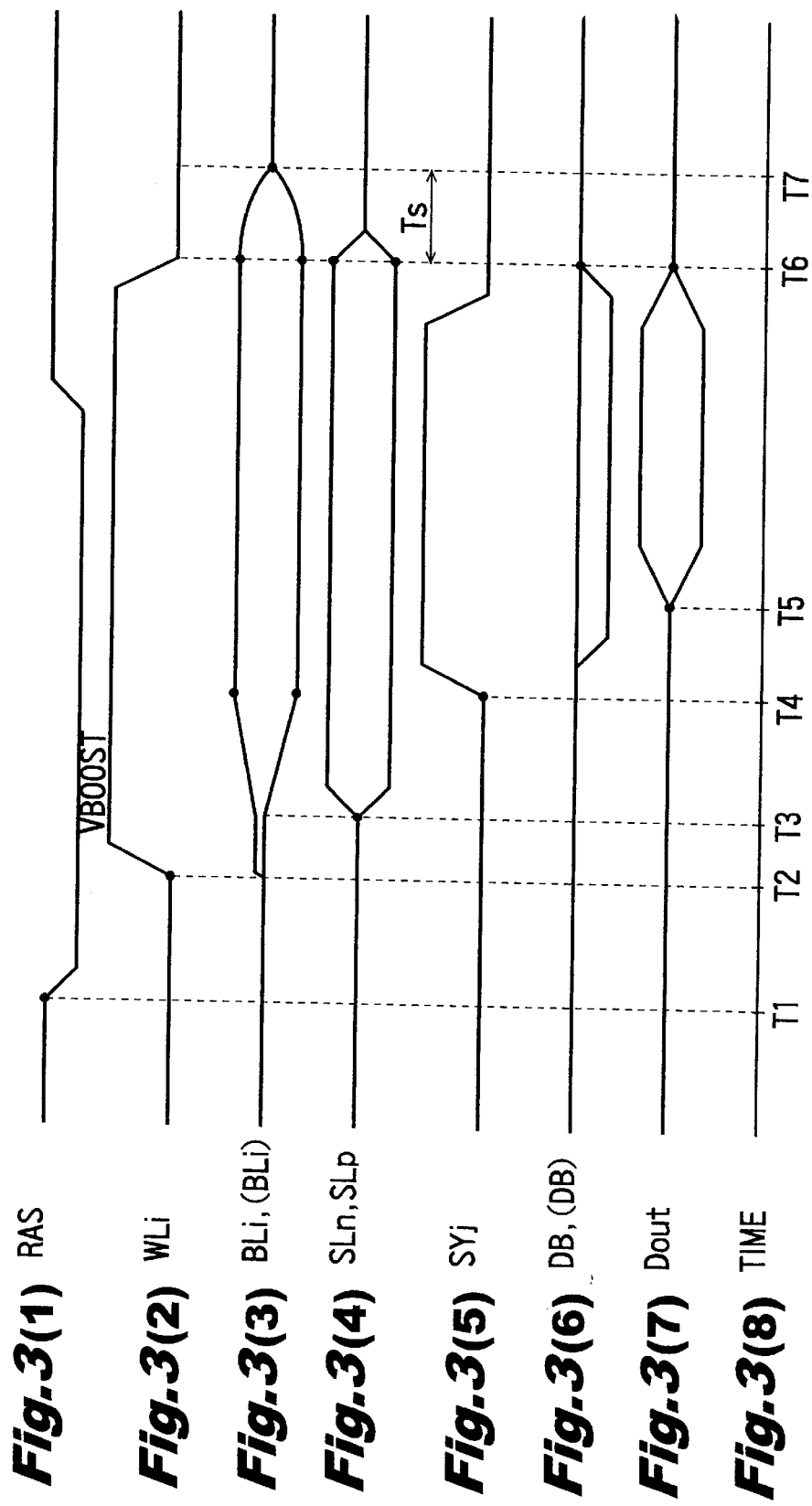

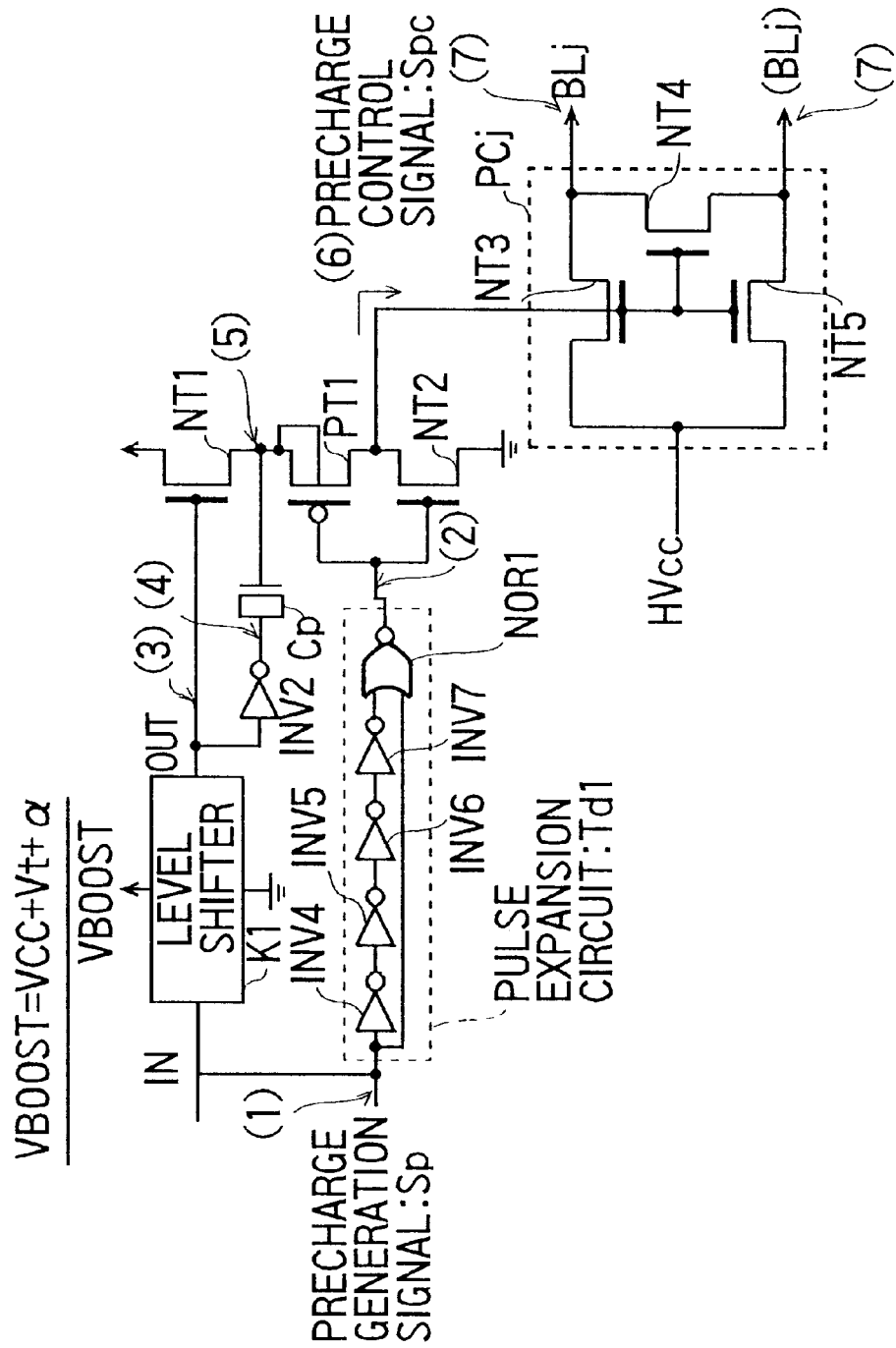

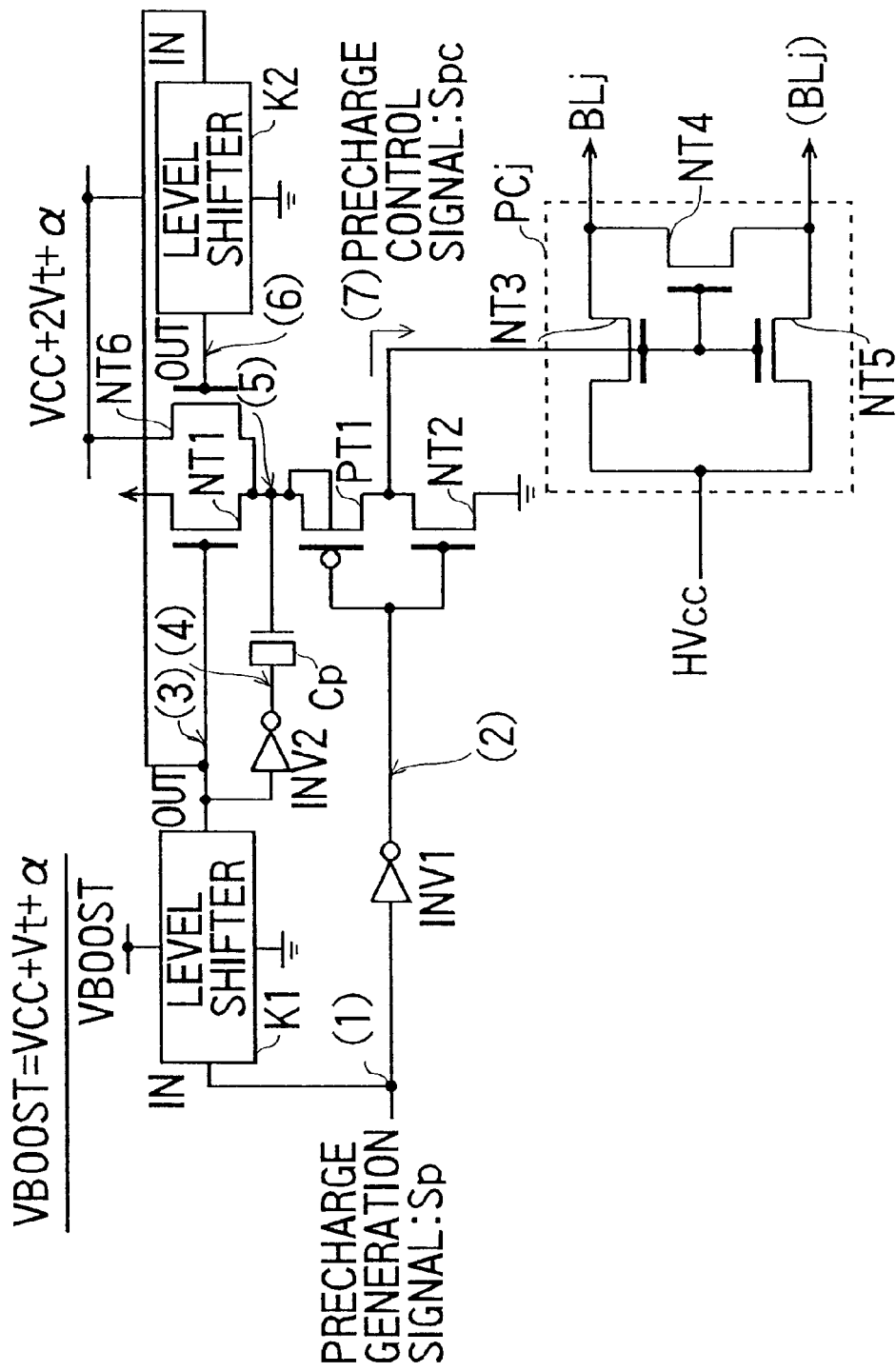

PRECHARGE CONTROL SIGNAL GENERATING CIRCUIT

BACKGROUND OF THE INVENTION

1. Field of the Invention

The present invention relates to a precharge control signal generating circuit of a semiconductor device, particularly of a semiconductor memory operating at a low voltage.

2. Description of the Related Art

In a semiconductor memory, a large number of memory cells storing data are arranged and connected in a matrix form by a bit line pair (paired two bit lines) in a column direction and a word line in a row direction. This bit line pair is equalized to a predetermined precharge voltage by a precharge control circuit during a precharge period. The precharge control circuit is controlled by a precharge control signal. The details are disclosed in, for example, Japanese Patent Application Laid-open No. Hei. 6-68666.

The foregoing conventional technique has the following problem to be solved.

When a power source voltage of a semiconductor memory is designed to be low, a potential difference between a gate and a source of an NMOS transistor constituting the precharge control circuit becomes small. As a result, there remains a problem to be solved that the NMOS transistor becomes hard to turn on, and a time required to equalize the bit line pair becomes long.

SUMMARY OF THE INVENTION

In order to solve the above problem, according to a first aspect of the invention, a precharge control signal generating circuit in a precharge control circuit of a semiconductor memory comprises a complementary amplifier for receiving a precharge generation signal and outputting a precharge control signal; an operation power source supplying circuit for supplying an operation power source to the complementary amplifier, the circuit having a first electrode connected to a power source voltage of a device and a second electrode connected to a first electrode of the complementary amplifier; a level shifter for receiving a part of the precharge generation signal, raising its level to a value higher than the power source voltage of the device by a predetermined value, and transmitting it to the operation power source supplying circuit; and a capacitor for receiving a part of an output of the level shifter, supplying it to the first electrode of the complementary amplifier, and pumping the operation power source of the complementary amplifier by a predetermined value.

According to a second aspect of the invention, the precharge control signal generating circuit of the first aspect further comprises a pulse expansion circuit for expanding a pulse width of the precharge generation signal inputted to the complementary amplifier, and a timing when the complementary amplifier is tuned off is made coincident with or delayed from a timing when the operation power source supplying circuit for supplying the operation power source is turned off.

According to a third aspect of the invention, the precharge control signal generating circuit of the first aspect receives a part of the output of the level shifter, amplifies it, and adds it to the precharge control signal.

According to a fourth aspect of the invention, the precharge control signal generating circuit of the first aspect further comprises a second level shifter for receiving a part of the output of the level shifter and raising its level; and a second operation power source supplying circuit for supplying the operation power source to the complementary amplifier, the circuit having a first electrode connected to a voltage exceeding the predetermined value, and a second electrode connected to the first electrode of the complementary amplifier, whereby a discharged charge of the capacitor is compensated.

BRIEF DESCRIPTION OF THE DRAWINGS

In the accompanying drawings:

FIGS. 1A and 1B are explanatory views of a precharge control signal generating circuit according to an embodiment 1 of the present invention;

FIGS. 3(1) to 3(8) are operation explanatory views of a semiconductor memory (DRAM);

FIGS. 5A and 5B are explanatory views of a precharge control signal generating circuit according to a modified example (No. 2) of the embodiment 1 of the present invention;

FIGS. 8A and 8B are explanatory views of a precharge control signal generating circuit according to a modified example (No. 2) of the embodiment 2 of the present invention.

DETAILED DESCRIPTION OF THE PREFERRED EMBODIMENTS

Hereinafter, preferred embodiments of the present invention will be described with reference to the drawings.

<Embodiment 1>

Figure 1B:
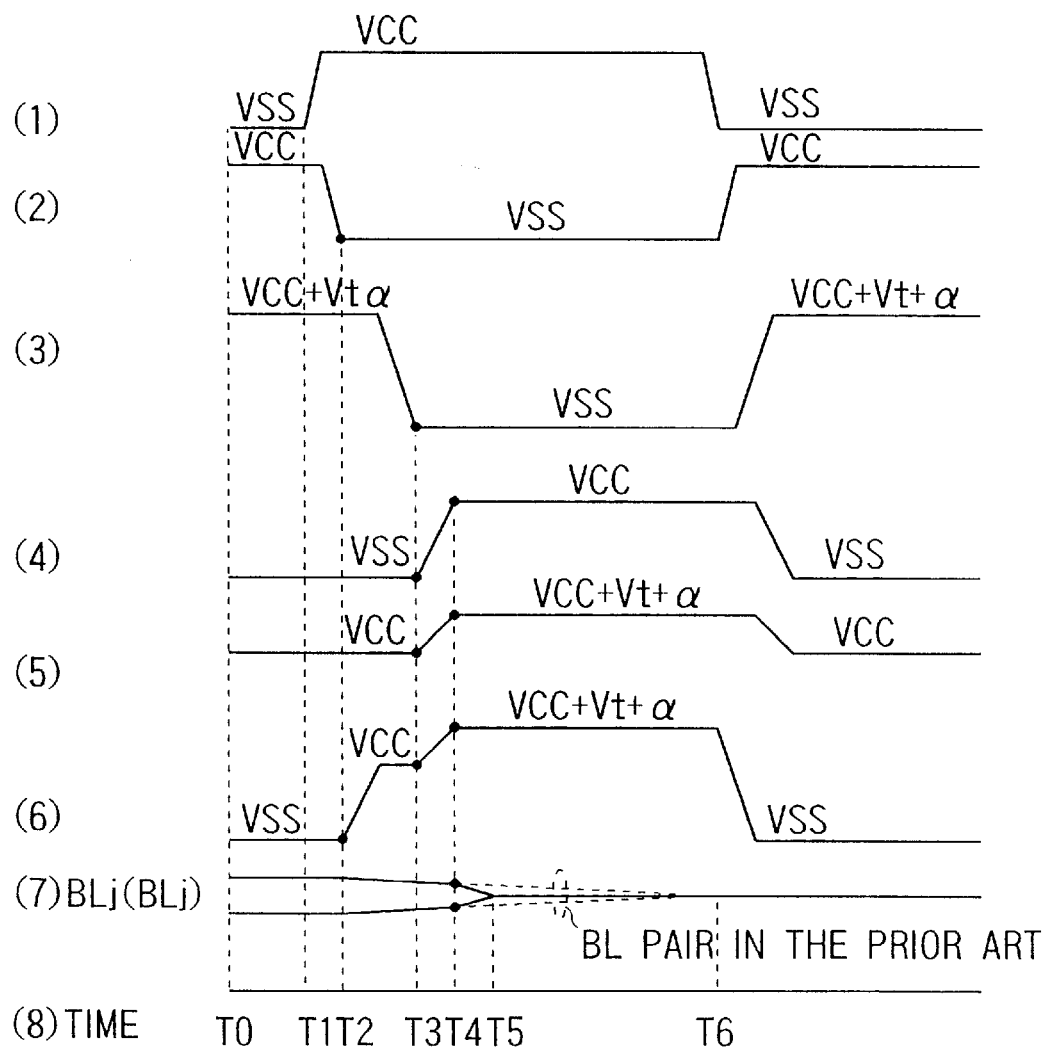

FIGS. 1A and 1B are explanatory views of a precharge control signal generating circuit according to the embodiment 1 of the present invention.

Before explaining the precharge control signal generating circuit of the embodiment 1 of the present invention, an outline of a semiconductor memory (a DRAM is named as an example) to which the invention is applied will be described with reference to the drawings.

Figure 2:
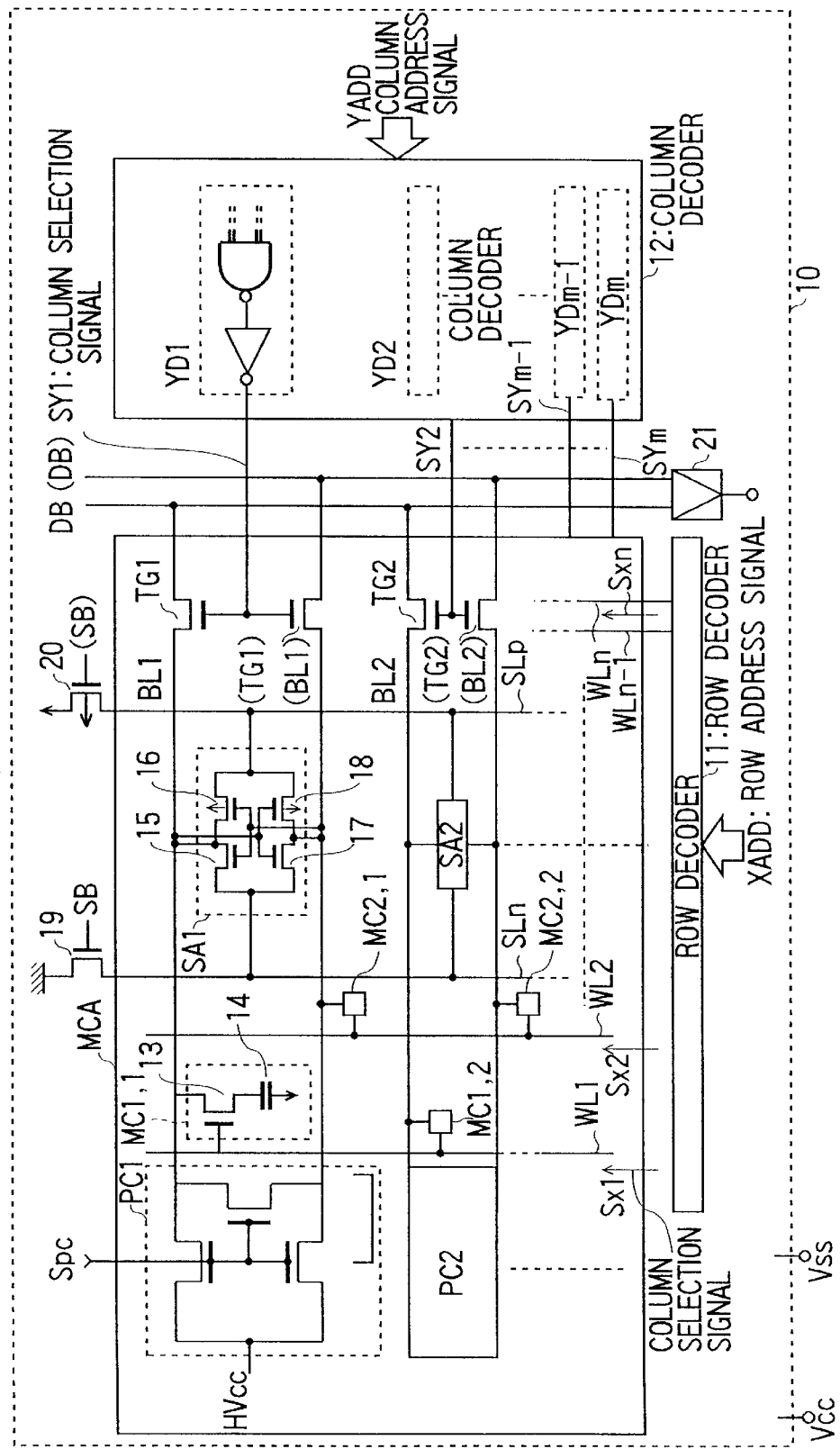
FIG. 2 is a partial circuit view of a semiconductor memory (DRAM)

FIG. 2 is a partial circuit view of a semiconductor memory (DRAM).

As shown in FIG. 2, a semiconductor memory (DRAM) 10 includes a number of memory cells MCij (i=1, 2, 3, 4 . . . n, j=1, 2, 3, 4, 5 . . . m, the same can be said of all i and j appearing subsequently) for storing data, a bit line pair BLj (BLj) connected to a plurality of memory cells MCij aligned in a column direction, a word line WLi connected to a plurality of memory cells MCij aligned in a row direction, a sense amplifier SAj for amplifying a voltage on the bit line pair BLj (BLj) during a sense period, a data bus pair DB (DB) for connecting a not-shown external device to the memory cells MCij, and a transfer gate pair TGj (TGj) for selectively connecting the bit line pair BLj (BLj) and the data bus pair DB (DB).

Besides, the semiconductor memory (DRAM) 10 includes a column decoder 12 for receiving a column address signal YADD from the not-shown external device and transmitting a column selection signal SYj to the transfer gate pair TGj (TGj), and a row decoder 11 for receiving a row address signal XADD from the not-shown external device and transmitting a row selection signal SXi to the word line WLi.

Further, the semiconductor memory includes a precharge control circuit PCj for setting the bit line BLj and the bit line (BLj) constituting the bit line pair BLj (BLj) to a predetermined precharge voltage HVcc during a precharge period. The precharge control circuit PCj is controlled by a not-shown precharge control signal generating circuit. The precharge control signal generating circuit is the subject matter of the invention.

A power source voltage Vcc and a ground voltage Vss are supplied to the semiconductor memory (DRAM) 10 from the outside. As an example, the power source voltage Vcc is 2±0.2 V.

The memory cell MCij is composed of, as an example, an enhancement N-channel MOS transistor (hereinafter referred to as a "NMOS") 13, and a capacitance 14. A gate electrode of the NMOS 13 is connected to the word line, the one electrode is connected to the bit line BLj, and the other electrode is connected to the capacitance 14. The capacitance 14 is connected between the source electrode of the NMOS 13 and a reference potential.

The sense amplifier SAj is composed of NMOSs 15 and 17, and enhancement P-channel MOS transistors (hereinafter referred to as "PMOS") 16 and 18. The gate electrodes of the NMOS 15 and the PMOS 16 are connected to the bit line (BLj), and the gate electrodes of the NMOS 17 and the PMOS 18 are connected to the bit line BLj, respectively.

The source electrodes of the PMOS 16 and the PMOS 18 are connected to a sense amplifier activation supply line SLp, and the source electrodes of the NMOS 15 and the NMOS 17 are connected to a sense amplifier activation supply line SLn, respectively. The drain electrode of the PMOS 16 and the drain electrode of the NMOS 15 are connected to the bit line BLj, and the drain electrode of the PMOS 18 and the drain electrode of the NMOS 17 are connected to the bit line (BLj), respectively.

The sense amplifier activation supply line SLp is connected to an internal power source voltage IVcc through a PMOS 20, and the sense amplifier activation supply line SLn is connected to a ground voltage through an NMOS 19. When a sense amplifier control signal (SB) is applied to the PMOS 20, and a sense amplifier control signal SB is applied to the NMOS 19, the sense amplifier SAj is a portion for amplifying a voltage between the bit line BLj and the bit line (BLj).

The row decoder 11 receives the row address signal XADD from the not-shown external device, decodes it, and selects a row of the memory cell array. The row decoder is a portion for transmitting the row selection signal SXi to the word line WLi of this selected row.

The column decoder 12 is composed of a plurality of unit column decoders YDi. The column decoder 12 receives the column address signal YADD from the not-shown external device, decodes it, and selects a column of the memory cell array. The column decoder is a portion for transmitting the column selection signal SYj to the bit line pair BLj (BLj) of this selected column through the transfer gate pair TG1 (TG1).

The transfer gate pair TG1 (TG1) is a portion for transmitting data on the bit line pair BLj (BLj) to the data bus pair DB (DB) in response to the column selection signal SYj. The data are transmitted to the not-shown external device through an input/output circuit.

The outline of the operation of the foregoing semiconductor memory (DRAM) will be described with reference to a time chart.

FIGS. 3(1) to 3(8) are operation explanatory views of the semiconductor memory (DRAM).

FIG. 3(1) shows a RAS (Row Address Strobe) signal, FIG. 3(2) shows a voltage on the word line WLi, FIG. 3(3) shows a voltage on the bit line pair BLj (BLj), FIG. 3(4) shows a voltage on the sense amplifier activation supply line SLp and the sense amplifier activation supply line SLn, FIG. 3(5) shows a column selection signal, FIG. 3(6) shows a voltage on the data bus pair DB (DB), FIG. 3(7) shows an output of an input/output circuit 21, and FIG. 3(8) shows time T common to FIGS. 3(1) to 3(7).

In accordance with the time T of FIG. 3(8), the outline of the operation of the semiconductor memory (DRAM) will be described.

Time T1

The RAS signal comes to an L level, and this semiconductor memory (DRAM) is activated. At this time, both the bit line pair BLj and the bit line (BLj) are equalized to the precharge voltage HVcc by the precharge control circuit PCj (FIG. 2). This precharge voltage HVcc is set to half of a normal power source voltage.

Time T2

The row decoder 11 (FIG. 2) receives the row address signal XADD from the not-shown external device, decodes it, and transmits the row selection signal SXi to the predetermined row word line WLi (FIG. 2).

Time T3

Data stored in the memory cell MCij (FIG. 2) connected to this word line WLi (FIG. 2) appear as a change of voltage on the bit line pair BLj (BLj). When the sense amplifier control signal SB and the sense amplifier control signal (SB) are applied with a slight delay to the sense amplifier activation supply line SLp and the sense amplifier activation supply line SLn (FIG. 2), the sense amplifier SAj (FIG. 2) is activated. As a result, the voltage on the bit line pair BLj (BLj) is amplified.

Time T4

Either one of the voltages of the bit line pair BLj (BLj) is amplified to a voltage close to the power source voltage Vcc, and the other voltage is amplified to the ground voltage Vss.

The column decoder 12 (FIG. 2) receives the column address signal YADD from the not-shown external device, decodes it, and transmits the column selection signal SYj to the predetermined bit line pair BLj (BLj). As a result, the transfer gate pair TG1 (TG1) (FIG. 2) is turned on, the bit line pair BLj (BLj) and the data bus pair DB (DB) (FIG. 2) are connected to each other, and the data on the bit line pair BLj (BLj) are transmitted onto the data bus pair DB (DB).

Time T5

The data on the data bus pair (DB) are outputted to the not-shown external device through the input/output circuit.

Time T6

The row selection signal SXi, the column selection signal SYj, the sense amplifier control signal SB, and the sense amplifier control signal (SB) are respectively removed, and the readout of data is completed. At this time, although the voltages of FIGS. 3(2), 3(4), 3(5), 3(6) and 3(7) are returned to the initial state of the time Ti in a short time, the voltage of the bit line pair BLi (BLi) of FIG. 3(3) can not return to the initial state immediately.

Time T7

The voltage of the bit line pair BLi (BLi) returns to the precharge voltage HVcc, and one cycle of the data readout is completed.

This concludes the explanation of the outline of the operation of the semiconductor memory (DRAM). Here, the points to be noted are as follows:

[Points to be Noted]

A surplus delay time Ts is required from the end (time T6) of the data readout to the end (time T7) of one cycle of the data readout when the voltage of the bit line pair BLi (BLi) returns to the precharge voltage HVcc.

It is considered that the main factor of this delay time is that when a voltage is made low, Vgs of the NMOS transistor constituting the precharge circuit Pcj becomes small, so that the Ids of the NMOS transistor becomes low, and a time required for precharge is increased.

An object of the invention is to shorten this surplus delay time Ts.

This concludes the explanation of the object of the invention and its importance. Reference will be made to FIG. 1 again, and the precharge control signal generating circuit of the embodiment 1 of the present invention will be described.

FIG. 1A shows a circuit structure of the precharge control signal generating circuit, and FIG. 1B shows the operation of each portion in the circuit.

The precharge control signal generating circuit of the embodiment 1 of the present invention includes a level shifter K1, an inverter INV1, an inverter INV2, a capacitor Cp, an NMOS transistor NT1, an NMOS transistor NT2, and a PMOS transistor PT1.

Here, the NMOS transistor NT2 and the PMOS transistor PT1 form a complementary amplifier.

The NMOS transistor NT1 is an operation power source supplying circuit of the complementary amplifier.

As shown in FIG. 1A, a precharge generation signal Sp is branched to the level shifter K1 and the inverter INV1. The level shifter K1 is an inverter for raising the level of the precharge generation signal Sp to VBOOST.

The VBOOST is a voltage applied to the word line WLi (FIG. 2), and is normally set to VBOOST=Vcc+Vt+α. The voltage is set to higher than the power source voltage Vcc by Vt+α in order to accurately read an electric charge stored in the memory cell MCij. Here, Vt is a threshold voltage of the NMOS, and α is an adjustment value different according to design types.

The output of the level shifter K1 branches off into two, one being inputted to the inverter INV2 and the other being inputted to the gate of the NMOS transistor NT1. The output of the inverter INV2 is transferred to the capacitor Cp. The other terminal of the capacitor Cp is connected to the source/drain of the NMOS transistor NT1 and the source of the PMOS transistor PT1. That is, by the electric charge charged in the capacitor Cp, the voltage of the source/drain of the NMOS transistor NT1 and the source of the PMOS transistor PT1 is boosted. Normally, this state is called a pumping state.

On the other hand, the inversion output of the inverter INV1 is inputted to the gates of the PMOS transistor PT1 and the NMOS transistor NT2. The source of the NMOS transistor NT2 is connected to the ground voltage Vss, and its drain is connected to the drain of the PMOS transistor PT1. A precharge control signal Spc is outputted from a connection point between the drain of the NMOS transistor NT2 and the drain of the PMOS transistor PT1, and is transferred to the precharge control circuit PCj.

The precharge control circuit PCj includes an NMOS transistor NT3, an NMOS transistor NT4, and an NMOS transistor NT5. The gate of the NMOS transistor NT3, the gate of the NMOS transistor NT4, and the gate of the NMOS transistor NT5 are collectively connected, and receive the precharge control signal Spc.

A precharge voltage HVcc is applied to the drains/sources of the NMOS transistor NT3 and the NMOS transistor NT5, the sources/drains of the NMOS transistor NT3 and the NMOS transistor NT4 are connected to the bit line BLj, and the drain/source of the NMOS transistor NT5 and the source/drain of the NMOS transistor NT4 are connected to the bit line (BLj).

When the precharge control circuit PCj receives the precharge control signal Spc, all of the NMOS transistor NT3, the NMOS transistor NT4, and the NMOS transistor NT5 are turned on. As a result, the bit line BLj and the bit line (BLj) are respectively equalized to the precharge voltage HVcc.

Next, the operation of the precharge control signal generating circuit of the embodiment 1 of the present invention will be described with reference to FIG. 1B and in accordance with the time chart.

In FIGS. 1A and 1B, reference numeral (1) denotes the precharge generation signal; (2), output of the inverter INV1; (3), output of the level shifter K1; (4), output of the inverter INV2; (5), voltage of the drain of the PMOS transistor PT1; (6), the precharge control signal Spc; (7), voltages of the bit line pair BLj (BLj); and (8), time common to (1) to (7).

Time T0

The signal (1) maintains the ground voltage Vss; (2), the power source voltage Vcc; (3), VBOOST voltage of Vcc+Vt+α; (4), the ground voltage Vss; (5), the power source voltage Vcc; (6), the ground voltage Vss; one of the voltages (7) of the bit line pair BLj (BLj), a voltage close to the power source voltage Vcc; and the other, a voltage close to the ground voltage Vss. The above state means the state between the time T5 and the time T6 of the already described operation explanatory view of the semiconductor memory (DRAM) of FIG. 3.

Time T1

(1) The precharge control signal generating circuit receives the precharge generation signal Sp.

(2) The output of the inverter INVL having received the precharge generation signal Sp starts to drop toward the ground voltage Vss with a slight delay.

Time T2

(2) The output of the inverter INVL having received the precharge generation signal Sp becomes the ground voltage Vss.

(6) The gates of the PMOS transistor PT1 and the NMOS transistor NT2 receive the output of the inverter INV1, amplification is made, and the output is raised to the power source voltage Vcc.

(7) At the same time, the bit line pair BLj (BLj) starts equalization toward the precharge voltage HVcc.

Time T3

(3) The output of the level shifter K1 having received the precharge generation signal Sp is changed to the ground voltage Vss with a slight delay.

(4) The output of the inverter INV2 having received the output of the level shifter K1 starts to rise toward the power source voltage Vcc.

(5) At the same time, by the electric charge charged in the capacitor Cp receiving the output of the inverter INV2, the voltage of the source of the NMOS transistor NT1 and the drain of the PMOS transistor PT1 starts to rise toward Vcc+Vt+α. This Vt+α is set with a value of the capacitor Cp in advance.

(6) Due to the rise of the voltage of the source of the NMOS transistor NT1 and the drain of the PMOS transistor PT1, the precharge control signal Spc also starts to rise from the power source voltage Vcc to Vcc+Vt+α.

Time T4

(4) The output of the inverter INV2 reaches the power source voltage Vcc, and subsequently maintains the voltage.

(5) The voltage of the source of the NMOS transistor NT1 and the drain of the PMOS transistor PT1 reaches Vcc+Vt+α, and the voltage is subsequently maintained.

(6) The voltage of the precharge control signal Spc reaches Vcc+Vt+α, and the voltage is subsequently maintained.

(7) Since the precharge control signal Spc has risen, the bit line pair BLj (BLj) accelerates equalization to the precharge voltage HVcc.

Time T5

(7) The voltages of the bit line pair BLj (BLj) complete equalization to the precharge voltage HVcc.

This concludes the explanation of the operation of the precharge control signal generating circuit of the embodiment 1 of the present invention. The points to be noted in this operation explanation are as follows:

[Points to be Noted]

1. Since the voltage of the source/drain of the NMOS transistor NT1 and the source of the PMOS transistor PT1 is boosted (pumped) by the electric charge charged in the capacitor CP, the voltage of the precharge signal becomes higher than the power source voltage Vcc. Here, as an example, the voltage becomes higher by Vt+α.

2. As a result, an equalization time of the bit line pair BLj (BLj) to the precharge voltage HVcc is shortened. As an example, it becomes possible to shorten the time from time T6 when the equalization is completed in the prior art to the time T5 by the voltage rise of the precharge signal.

3. The potential difference of the capacitor Cp between the input and output is maintained to the power source voltage Vcc at the initial state, and the voltage rise of Vt+α has only to be charged, so that the capacitance may be relatively small and an occupied area becomes small.

4. As a point to be noted here, there is a simple question of whether to use the VBOOST as it is as the precharge control signal Spc. However, the precharge control signal Spc is inputted to a plurality of precharge circuits Pcj, so that the load is high like the word line Wli. Thus, it is difficult for the VBOOST circuit to cover the two signals, and it is necessary to separately generate the precharge control signal Spc.

Next, modified examples of the embodiment 1 of the present invention will be described.

MODIFIED EXAMPLE (1)

Figure 4A:
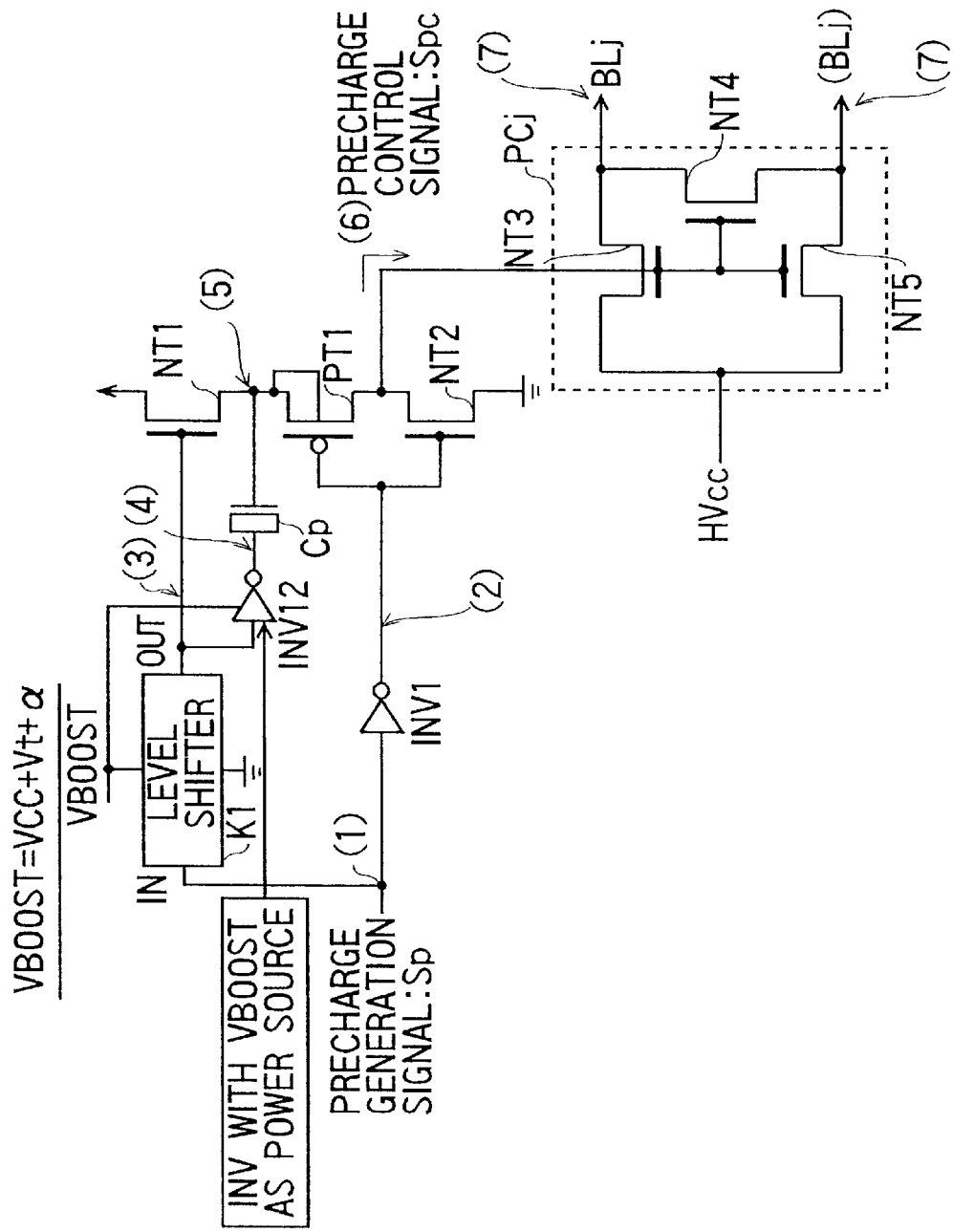
FIGS. 4A and 4B are explanatory views of a precharge control signal generating circuit according to a modified example (No. 1) of the embodiment 1 of the present invention.
Figure 4B:
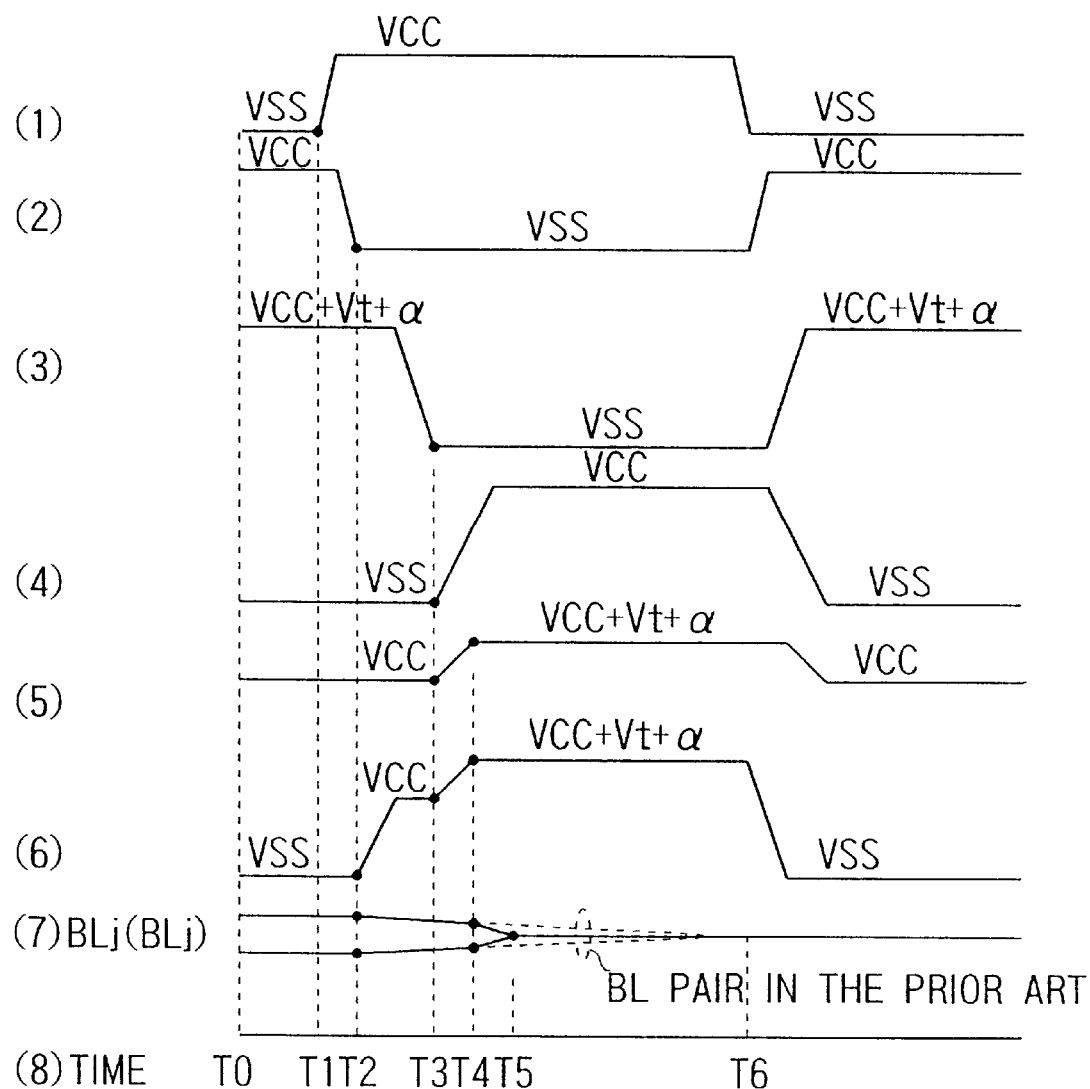

FIGS. 4A and 4B are explanatory views of a modified example (1) of the precharge control signal generating circuit according to the embodiment 1 of the present invention.

FIG. 4A shows a circuit structure of the precharge control signal generating circuit, and FIG. 4B shows the operation of each portion in the circuit.

The precharge control signal generating circuit includes a level shifter K1, an inverter INV1, an inverter INV12, a capacitor Cp, an NMOS transistor NT1, an NMOS transistor NT2, and a PMOS transistor PT1.

Only the difference from the state (FIG. 1) before the modification will be described.

The output of the level shifter K1 branches off into two, one being inputted to the inverter INV12 and the other being inputted to the gate of the NMOS transistor NT1. The output of the inverter INV12 is transferred to the capacitor Cp. The other terminal of the capacitor Cp is connected to the source/drain of the NMOS transistor NT1 and the source of the PMOS transistor PT1. That is, by the electric charge charged in the capacitor Cp, the voltages of the source/drain of the NMOS transistor NT1 and the source of the PMOS transistor PT1 are boosted (pumped).

Here, the difference from the state (FIG. 1) before the modification is that in the state (FIG. 1) before the modification, the output of the level shifter K1 branches off into two, and is inputted to the inverter INV2 and the gate of the NMOS transistor NT1. The power source voltage of the inverter INV2 is Vcc.

On the other hand, in the modified example (FIG. 4), the inverter INV2 is replaced by the inverter INV12, and the power source voltage of the inverter INV12 is VBOOST. The other structures are quite the same.

The difference in the operation is that in (4) of FIG. 4B, the inverter INV12 receives the output of the level shifter K1 at time T3 and the output of the inverter INV12 starts to rise toward VBOOST power source Vcc+Vt+α.

The other operations are quite the same as the state (FIG. 1) before the modification.

In this way, by changing the output of the inverter INV12 to VBOOST power source Vcc+Vt+α, an occupied area of the capacitor Cp can be made smaller than the state (FIG. 1) before the modification.

MODIFIED EXAMPLE (2)

Figure 5B:
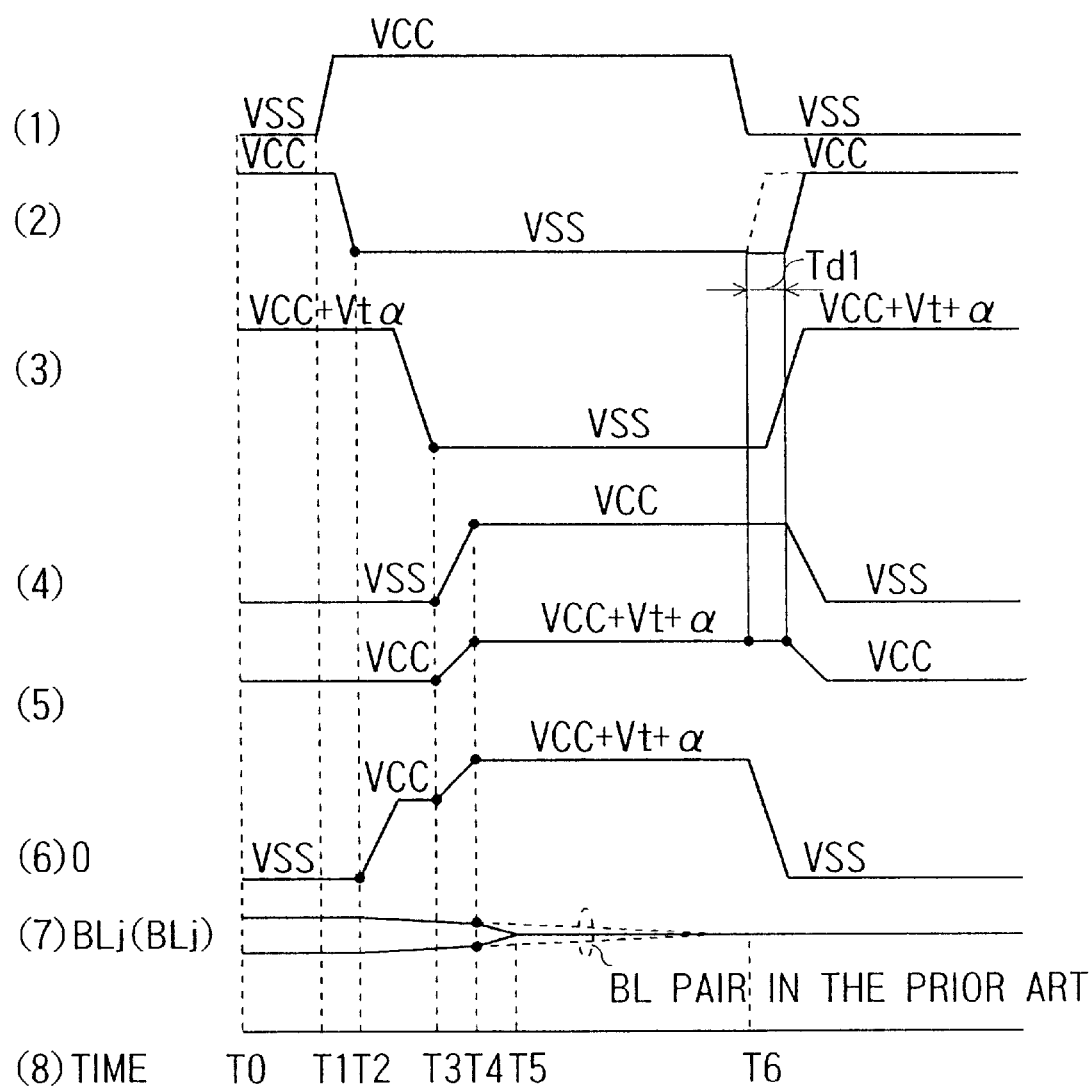

FIGS. 5A and 5B are explanatory views of a modified example (2) of the precharge control signal generating circuit according to the embodiment 1 of the present invention.

FIG. 5A shows a circuit structure of the precharge control signal generating circuit, and FIG. 5B shows the operation of each portion of the circuit.

The precharge control signal generating circuit of the modified example (No. 2) according to the embodiment 1 of the present invention includes a level shifter K1, a pulse expansion circuit Td1, an inverter INV2, a capacitor Cp, an NMOS transistor NT1, an NMOS transistor NT2, and a PMOS transistor PT1.

Here, the pulse expansion circuit Td1 is composed of inverters INV4 to inverter INV7, and a NOR gate NOR1.

Hereinafter, only the difference from the state (FIG. 1) before the modification will be described.

As shown in FIG. 5A, a precharge generation signal Sp is branched to the level shifter K1 and the pulse expansion circuit Td1. The inversion output of the pulse expansion circuit Td1 is inputted to the gates of the PMOS transistor PT1 and the NMOS transistor NT2. The other structures are quite the same as the state (FIG. 1) before the modification.

The difference in the operation is that the time of rising of the output of the pulse expansion circuit Td1 is delayed by a Td1 time through the inverters INV4 to INV7.

The other operations are quite the same as the state (FIG. 1) before the modification.

In the state (FIG. 1) before the modification, during this Td1 time, the potential of the gates of the PMOS transistor PT1 and the NMOS transistor NT2 is the power source voltage Vcc ((2) of FIG. 1B), and the potential of the source of the PMOS transistor PT1 is Vcc+Vt+α ((5) of FIG. 1B). Thus, a leak current flows from the source of the PMOS transistor PT1 to the ground potential through the NMOS transistor NT1. In order to reduce this leak current, according to the modified example (No. 2), the rising of the output of the pulse expansion circuit Td1 is delayed by the Td1 time ((2) of FIG. 5B) through the delay time of the inverters INV4 to INV7.

<Effects of the Embodiment 1>

1. The operation power source of the complementary amplifier composed of the PMOS transistor PT1 and the NMOS transistor NT2 is pumped by the electric charge charged in the capacitor Cp, and the level of the precharge generation signal is raised.

2. As a result, an equalization time of the bit line pair is shortened, and speedup of the semiconductor memory (for example, DRAM) can be realized.

3. Further, by providing the pulse expansion circuit, the timing when the NMOS transistor NT1 is turned off and the timing when the complementary amplifier is turned off are made coincident with each other or delayed, so that consumed electric power can be reduced.

<Embodiment 2>

Figure 6A:
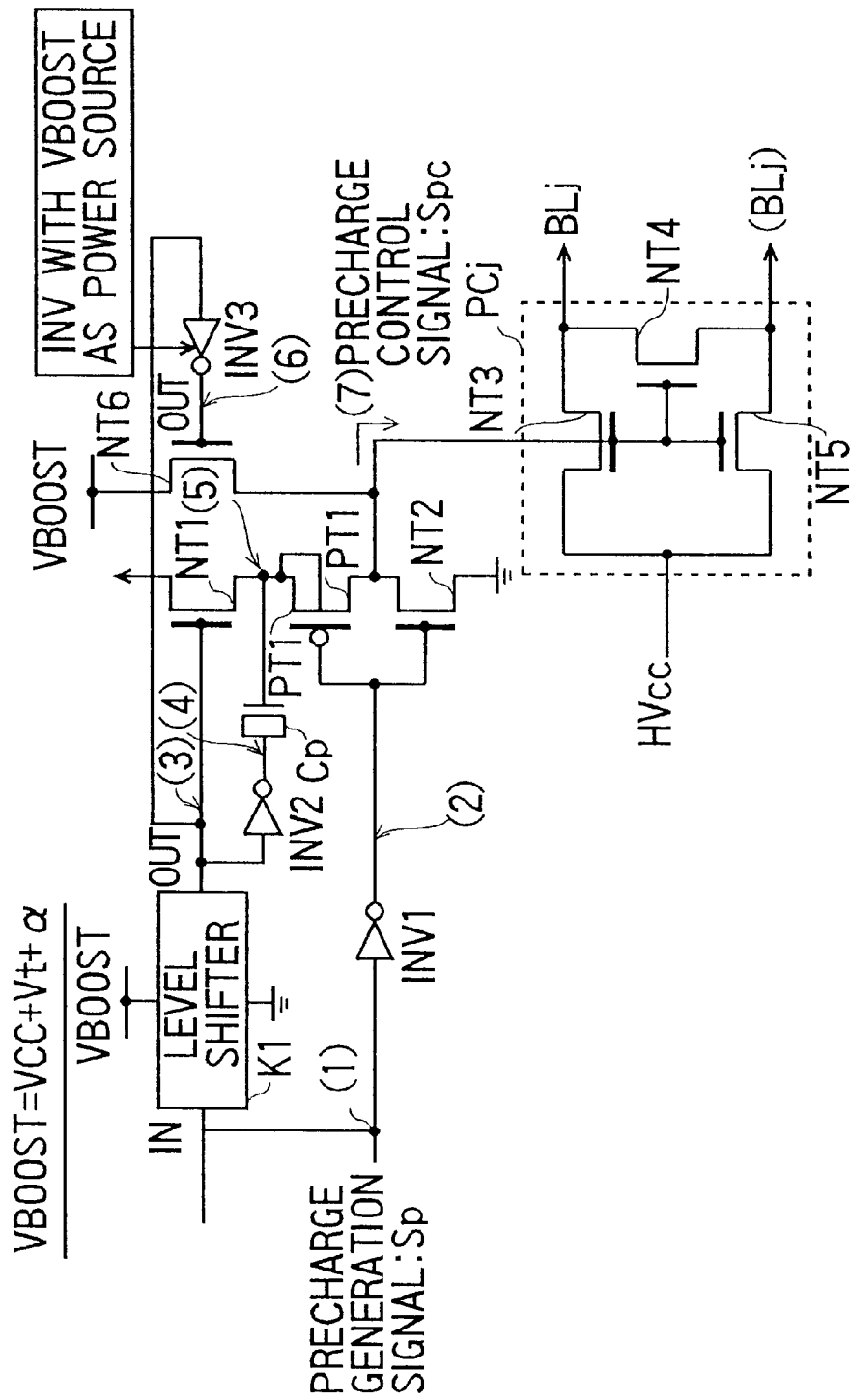
FIGS. 6A and 6B are explanatory views of a precharge control signal generating circuit according to an embodiment 2 of the present invention.
Figure 6B:
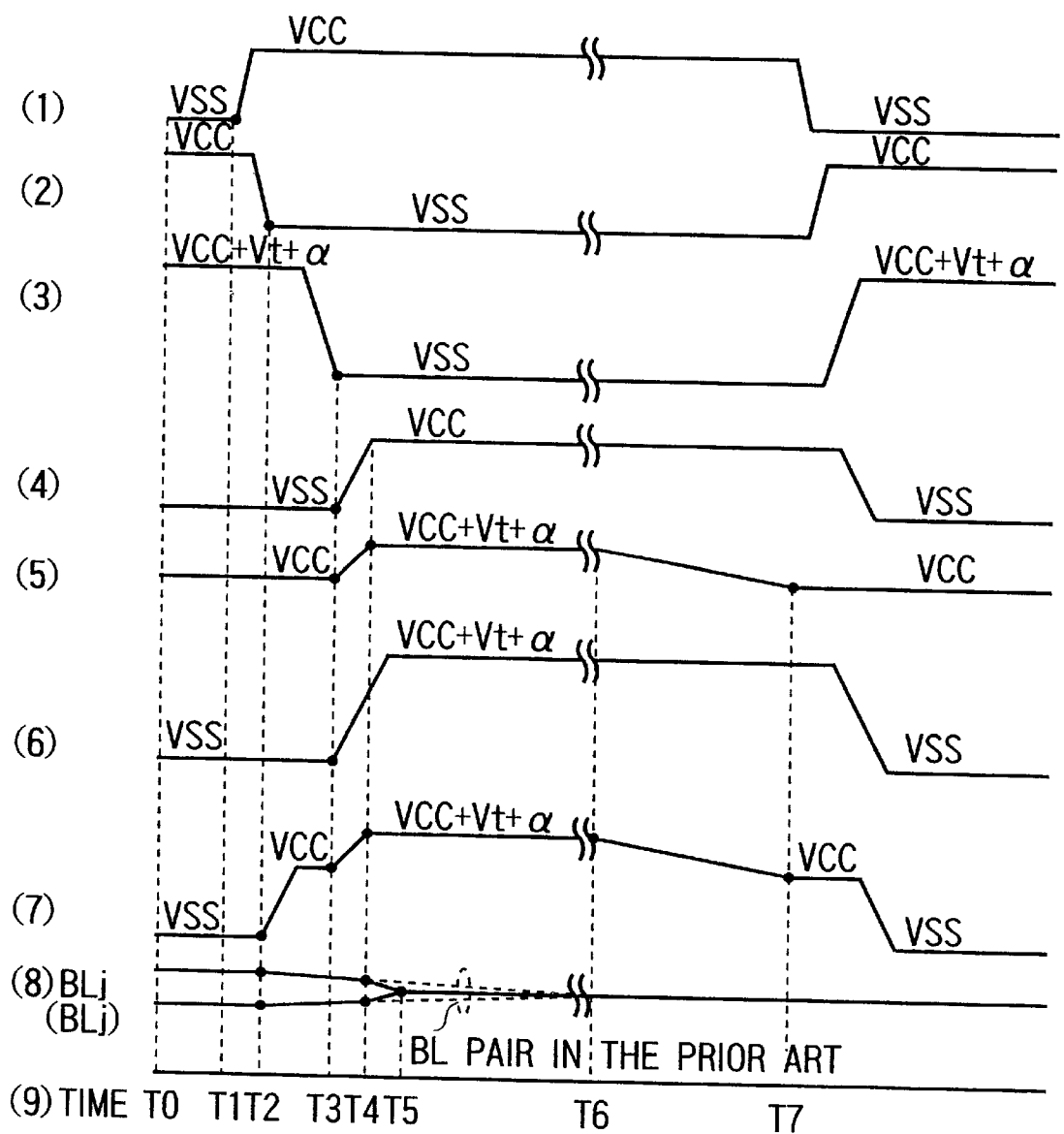

FIGS. 6A and 6B are explanatory views of a precharge control signal generating circuit of embodiment 2 of the present invention.

FIG. 6A shows a circuit structure of the precharge control signal generating circuit, and FIG. 6B shows the operation of each portion in the circuit.

The precharge control signal generating circuit of the embodiment 2 of the present invention includes a level shifter K1, an inverter INV1, an inverter INV2, a capacitor Cp, an NMOS transistor NT1, an NMOS transistor NT2, an inverter INV3, an NMOS transistor NT6, and a PMOS transistor PT1.

As shown in FIG. 6A, a precharge generation signal Sp is branched to the level shifter K1 and the inverter INV1. The level shifter K1 is an inverter for raising the level of the precharge generation signal Sp to VBOOST.

The VBOOST is a voltage applied to the word line WLi (FIG. 2), and is normally set to VBOOST=Vcc+Vt+α. The voltage is set to higher than the power source voltage Vcc by Vt+α in order to accurately read an electric charge stored in the memory cell MCij. Here, Vt is a threshold voltage of the NMOS, and a is an adjustment value different according to design types.

The output of the level shifter K1 branches into three, one being inputted to the inverter INV2, another being inputted to the gate of the NMOS transistor NT1, and the third being inputted to the inverter INV3. The output of the inverter INV2 is transferred to the capacitor Cp. The other terminal of the capacitor Cp is connected to the source/drain of the NMOS transistor NT1 and the source of the PMOS transistor PT1. That is, the voltage of the source/drain of the NMOS transistor NT1 and the source of the PMOS transistor PT1 is booted by the electric charge charged in the capacitor Cp.

On the other hand, the inversion output of the inverter INV1 is inputted to the gates of the PMOS transistor PT1 and the NMOS transistor NT2. The source of the NMOS transistor NT2 is connected to the ground voltage Vss, and its drain is connected to the drain of the PMOS transistor PT1.

Also, the drain of the PMOS transistor PT1 is connected to the source/drain of the NMOS transistor NT6, and the drain/source and the gate of the NMOS transistor NT6 is respectively connected to the VBOOST and the output terminal of the inverter INV3.

A precharge generation signal Spc is outputted from a connection point between the drain of the NMOS transistor NT2 and the drain of the PMOS transistor PT1, and is transferred to a precharge control circuit PCj.

The precharge control circuit PCj includes an NMOS transistor NT3, an NMOS transistor NT4, and an NMOS transistor NT5. The gate of the NMOS transistor NT4, the gate of the NMOS transistor NT4, and the gate of the NMOS transistor NT5 are collectively connected and receive the precharge generation signal Spc.

A precharge voltage HVcc is applied to the drains/sources of the NMOS transistor NT3 and the NMOS transistor NT5, the sources/drains of the NMOS transistor NT3 and the NMOS transistor NT4 are connected to the bit line BLj, and the source/drain of the NMOS transistor NT5 and the drain/source of the NMOS transistor NT4 are connected to the bit line (BLj).

When the precharge control circuit PCj receives the precharge control signal Spc, the NMOS transistor NT3, the NMOS transistor NT4, and the NMOS transistor NT5 are all turned on. As a result, the bit line BLj and the bit line (BLj) are respectively equalized to the precharge voltage HVcc.

Next, the operation of the precharge control signal generating circuit of the embodiment 2 of the present invention will be described with reference to FIG. 6B and in accordance with the time chart.

In FIGS. 6A and 6B, reference numeral (1) denotes the precharge generation signal; (2), an output of the inverter INV1; (3), an output of the level shifter K1; (4), an output of the inverter INV2; (5), a voltage of the drain of the PMOS transistor PT1; (6), an output of the inverter INV3; (7), the precharge control signal Spc; (8), voltages of the bit line pair BLj (BLj); and (9), time common to (1) to (9).

Time T0

The precharge generation signal (1) maintains the ground voltage Vss; (2), the power source voltage Vcc; (3), the VBOOST voltage; (4), the ground voltage Vss; (5), the power source voltage Vcc; (6), the ground voltage Vss; (7), the ground voltage Vss; one of the voltages (8) of the bit line pair BLj (BLj), a voltage close to the power source voltage Vcc; and the other, a voltage close to the ground voltage Vss. The above state means a state between the time T5 and the time T6 of the already explained operation explanatory view of the semiconductor memory (DRAM) of FIG. 3.

Time T1

(1) The precharge control signal generating circuit receives the precharge generation signal Sp.

(2) The output of the inverter INV1 having received the precharge generation signal Sp starts to drop toward the ground voltage Vss with a slight delay.

Time T2

(2) The output of the inverter INV1 having received the precharge generation signal Sp becomes the ground voltage Vss.

(7) The gates of the PMOS transistor PT1 and the NMOS transistor NT2 receive the output of the inverter INV1, amplification is made, and the output is raised to the power source voltage Vcc.

(8) At the same time, the bit line pair BLj (BLj) starts equalization toward the precharge voltage HVcc.

Time T3

(3) The output of the level shifter K1 having received the precharge generation signal Sp is changed to the ground voltage Vss with a slight delay.

(4) The output of the inverter INV2 having received the output of the level shifter K1 starts to rise toward the power source voltage Vcc.

(5) At the same time, by the electric charge charged in the capacitor Cp receiving the output of the inverter INV2, the voltage of the source/drain of the NMOS transistor NT1 and the source of the PMOS transistor PT1 starts to rise toward Vcc+Vt+α. This Vt+α is set with a value of the capacitor Cp in advance.

(6) At the same time, the output of the inverter INV3 having received the output of the level shifter K1 starts to rise toward VBOOST.

(7) Due to the rising of the voltage of the source/drain of the NMOS transistor NT1 and the source of the PMOS transistor PT1, the precharge control signal Spc also starts to rise from the power source voltage Vcc to Vcc+Vt+α.

Time T4

(4) The output of the inverter INV2 reaches the power source voltage Vcc, and the voltage is subsequently maintained.

(5) The voltage of the source/drain of the NMOS transistor NT1 and the source of the PMOS transistor PT1 reaches Vcc+Vt+α, and the voltage is subsequently maintained.

(6) The output of the inverter INV3 having received the output of the level shifter K1 reaches the VBOOST with a slight delay from the time T4, and the voltage is subsequently maintained.

(7) The voltage of the precharge control signal Spc reaches Vcc+Vt+α, and the voltage is subsequently maintained.

(8) Since the precharge control signal Spc has risen, the bit line pair BLj (BLj) accelerates equalization to the precharge voltage HVcc.

Time T5

(8) The voltages of the bit line pair BLj (BLj) complete the equalization to the precharge voltage HVcc.

Time T6

(5) The electric charge charged in the capacitor Cp starts to discharge, and the voltage of the source/drain of the NMOS transistor NT1 and the source of the PMOS transistor PT1 starts to drop from the voltage Vcc+Vt+α maintained until now.

(7) At the same time, the precharge control signal Spc starts to drop from the voltage Vcc+Vt+α maintained until now.

Time 7

(5) The capacitor Cp discharges the electric charge charged at time T3, the voltage of the source/drain of the NMOS transistor NT1 and the source of the PMOS transistor PT1 drops to the power source voltage Vcc, and this voltage is subsequently maintained.

(7) At the same time, the voltage of the precharge control signal Spc drops from the voltage Vcc+Vt+α maintained until now to the power source voltage Vcc. However, the electric charge is supplied to the drain of the PMOS transistor PT1 through the NMOS transistor NT6 while the output (6) voltage of the inverter INV3 is maintained at Vcc+Vt+α. Thus, as the drain voltage of the PMOS transistor PT1, a value obtained by subtracting the threshold voltage Vt of the NMOS transistor NT6 from Vcc+Vt+α, that is, a voltage close to the power source voltage Vcc is maintained.

This concludes the explanation of the operation of the precharge control signal generating circuit of the embodiment 2 of the present invention.

The points to be noted in the description of the operation are as follows:

[Points to be Noted]

Since the output of the inverter INV3 having received the output of the level shifter K1 is added to the precharge control signal Spc, even if the electric charge charged in the capacitor Cp is discharged, the precharge control signal Spc does not drop from the power source voltage Vcc.

Next, modified examples of the embodiment 2 of the present invention will be described.

MODIFIED EXAMPLE (No. 1)

Figure 7A:
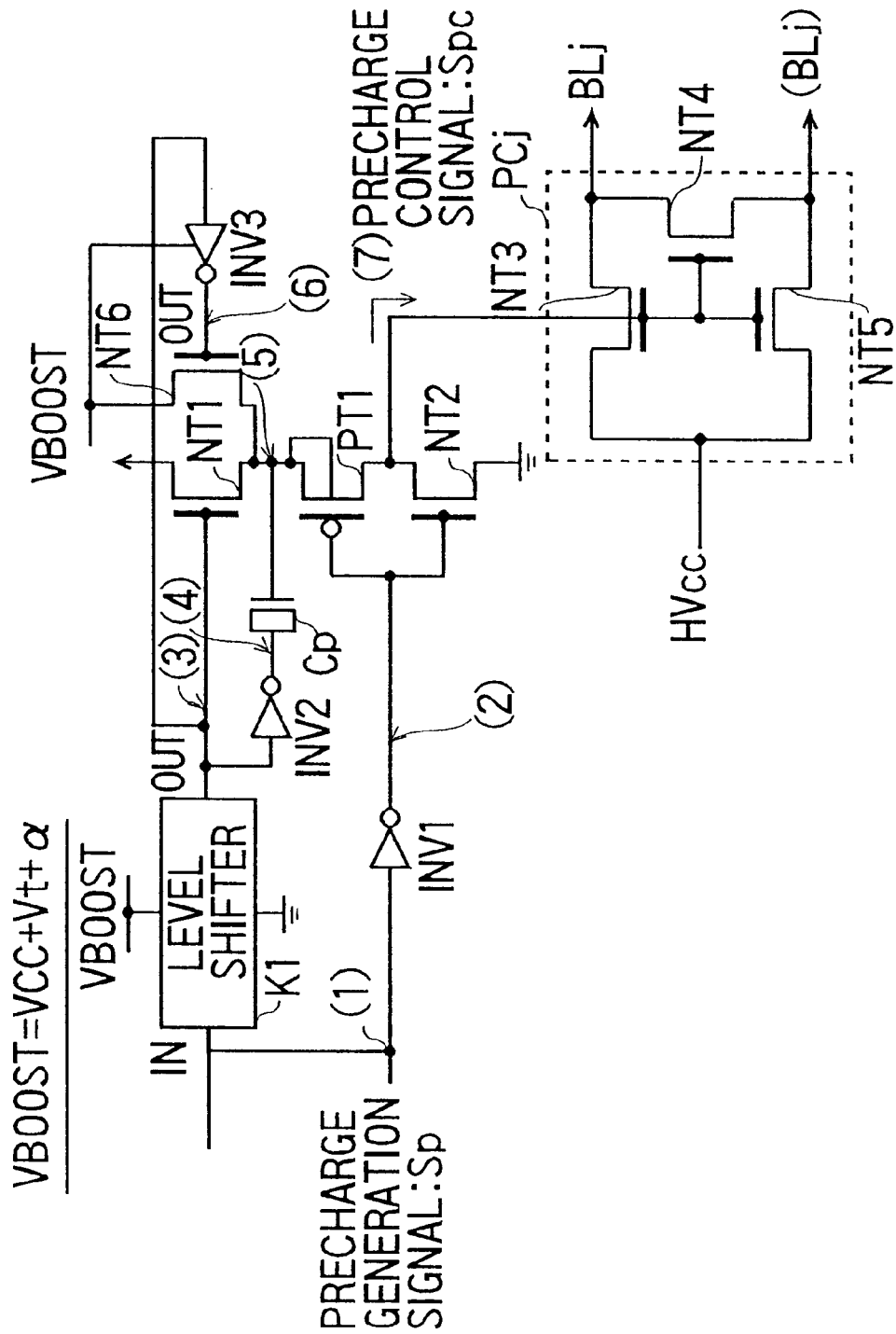
FIGS. 7A and 7B are explanatory views of a precharge control signal generating circuit according to a modified example (No. 1) of the embodiment 2 of the present invention.
Figure 7B:
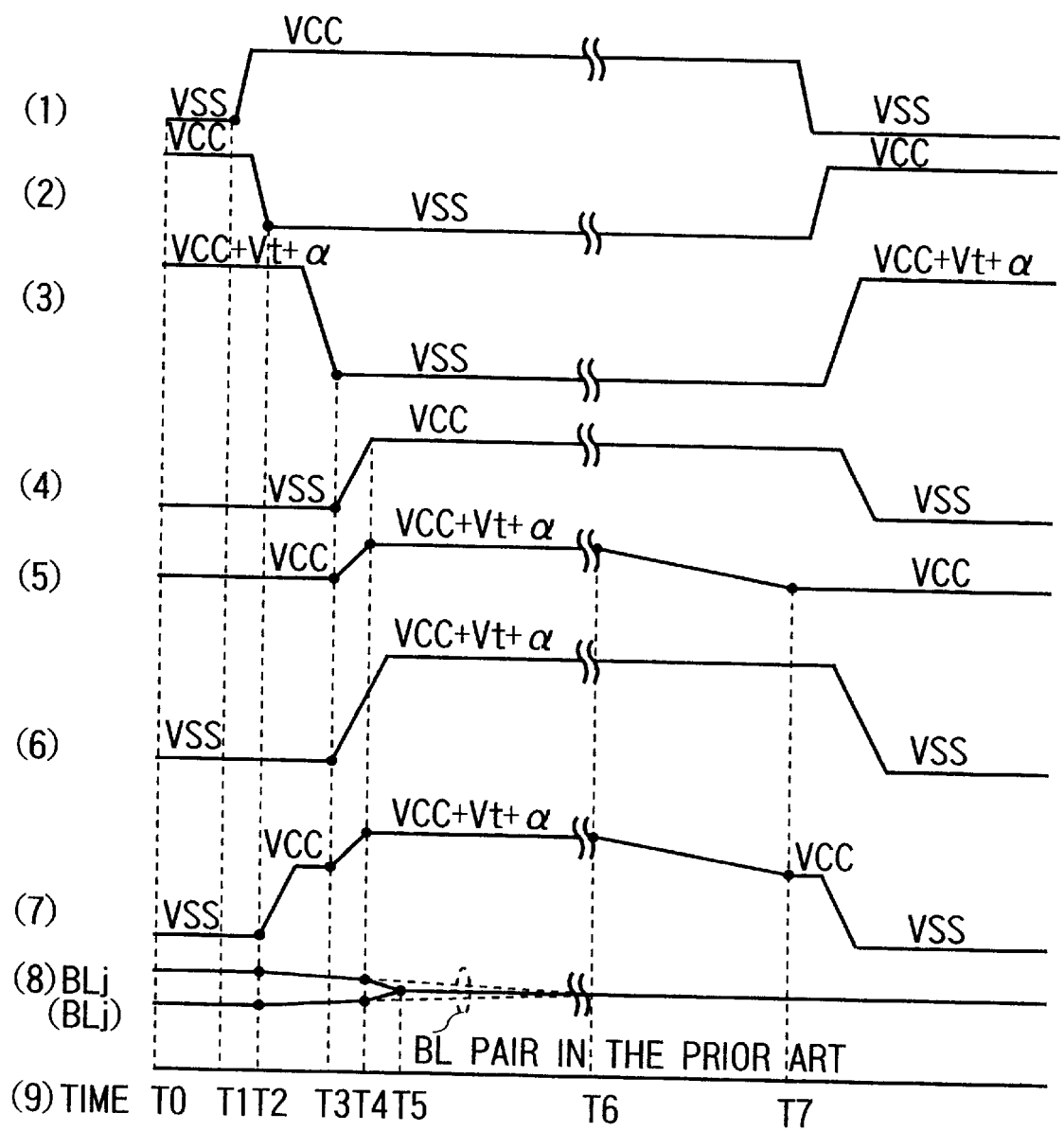

FIGS. 7A and 7B are explanatory views of the modified example (No. 1) of the precharge control signal generating circuit according to the embodiment 2 of the present invention.

FIG. 7A shows a circuit structure of the precharge control signal generating circuit, and FIG. 7B shows the operation of each portion in the circuit.

The precharge control signal generating circuit of the modified example (No. 1) includes a level shifter K1, an inverter INV1, an inverter INV2, a capacitor Cp, an NMOS transistor NT1, an NMOS transistor NT2, an inverter INV3, an NMOS transistor NT6, and a PMOS transistor PT1.

Only the difference from the state (FIG. 6) before the modification will be described.

As shown in FIG. 7A, a precharge generation signal Sp is branched to the level shifter K1 and the inverter INV1. The level shifter K1 is an inverter to raise the level of the precharge generation signal Sp to VBOOST.

The output of the level shifter K1 branches off into three, one being inputted to the inverter INV2, another being inputted to the gate of the NMOS transistor NT1, and the third being inputted to the inverter INV3. In the state (FIG. 6) before the modification, this output of the inverter INV3 is transferred to the drain of the PMOS transistor PT1 through the NMOS transistor NT6. However, in the modified example (No. 1), this output is transferred to the source of the PMOS transistor PT1. The other structures are quite the same as the structure (FIG. 6) before the modification.

Next, with reference to FIG. 7B and in accordance with the time chart, the operation of the precharge control signal generating circuit of the embodiment 2 of the present invention will be described.

Only the difference from the state (FIG. 6) before the modification will be described.

Time 7

(5) The capacitor Cp discharges the electric charge charged at time T4, the voltage of the source/drain of the NMOS transistor NT1 and the source of the PMOS transistor PT1 drops to the power source voltage Vcc, and this voltage is subsequently maintained.

(7) At the same time, the precharge control signal Spc drops from the voltage Vcc+Vt+α maintained until now to the power source voltage Vcc. However, the output (6) of the inverter INV3 is supplied to the source of the PMOS transistor PT1 through the NMOS transistor NT6 in the state where the output maintains Vcc+Vt+α. Thus, as the voltage of the source of the PMOS transistor PT1, a voltage obtained by subtracting the threshold voltage Vt of the NMOS transistor NT6 from Vcc+Vt+α, that is, a voltage close to the power source voltage Vcc is maintained.

The other operations are quite the same as the operation of the embodiment 2 of the present invention before the modification.

MODIFIED EXAMPLE (No. 2)

Figure 8B:
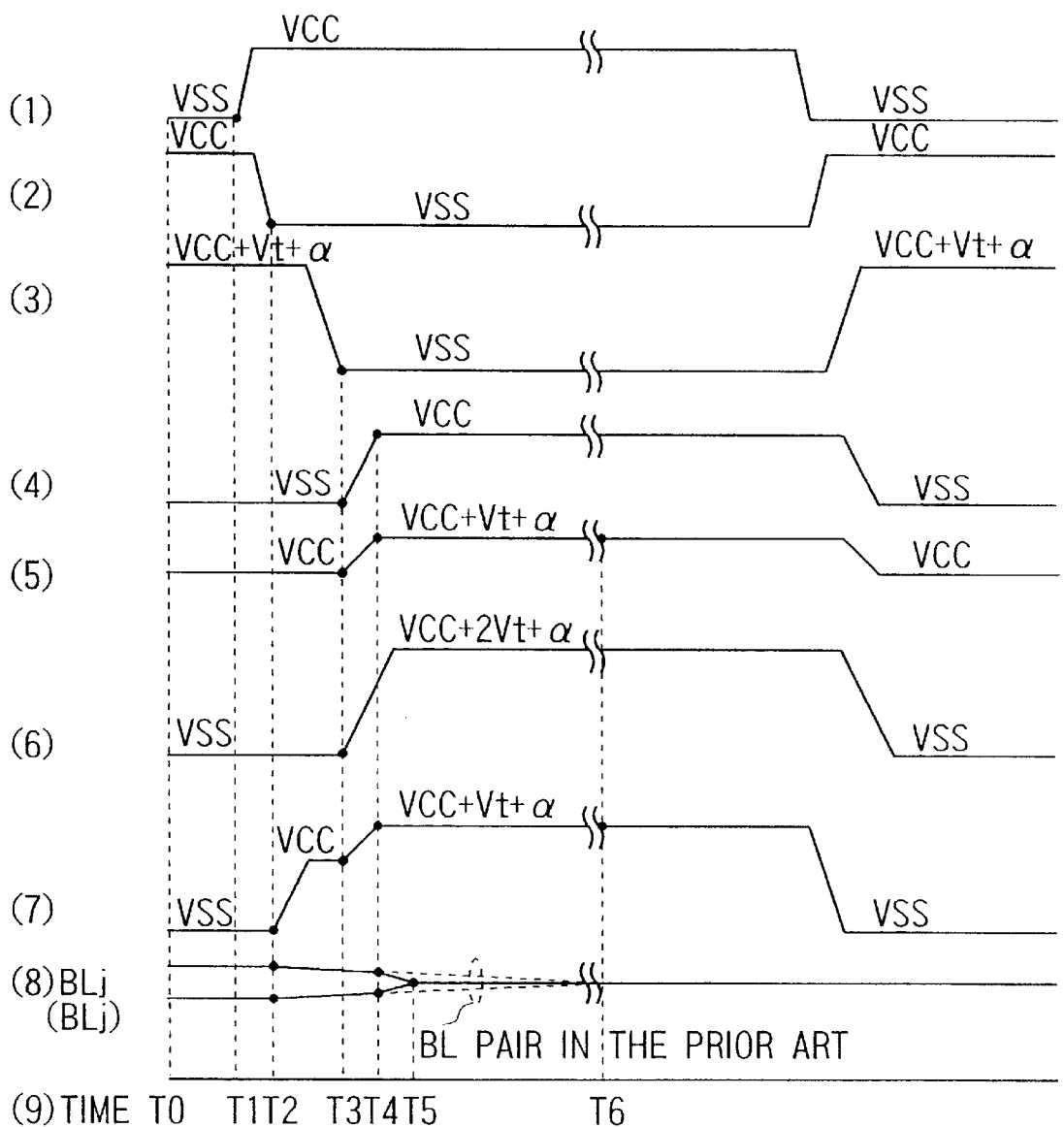

FIGS. 8A and 8B are explanatory views of the modified example (No. 2) of the precharge control signal generating circuit according to the embodiment 2 of the present invention.

FIG. 8A shows a circuit structure of the precharge control signal generating circuit, and FIG. 8B shows the operation of each portion in the circuit.

The precharge control signal generating circuit of the modified example (No. 2) includes a level shifter K1, an inverter INV1, an inverter INV2, a capacitor Cp, an NMOS transistor NT1, an NMOS transistor NT2, a level shifter K2, an NMOS transistor NT6, and a PMOS transistor PT1.

Only the difference from the state (FIG. 6) before the modification will be described.

As shown in FIG. 8A, a precharge generation signal Sp is branched to the level shifter K1 and the inverter INV1. The level shifter K1 is an inverter to raise the level of the precharge generation signal Sp to VBOOST.

The output of the level shifter K1 branches off into three, one being inputted to the inverter INV2, another being inputted to the gate of the NMOS transistor NT1, and the third being inputted to the level shifter K2. The inverter INV3 of the embodiment 2 of the present invention (FIG. 6) before the modification is replaced here by the level shifter K2 to which Vcc+2Vt+α is suppl ied as the power source voltage. The output of the level shifter K2 is transferred to the source of the PMOS transistor PT1 through the NMOS transistor NT6 to which Vcc+2Vt+α is supplied as the voltage connected to the source/drain. The other structures are quite the same as the structure of the embodiment 2 of the present invention (FIG. 6) before the modification.

Next, with reference to FIG. 8B and in accordance with the time chart, the operation of the precharge control signal generating circuit of the modified example (No. 2) according to the embodiment 2 of the present invention will be described.

Only the difference from the state (FIG. 6) before the modification will be described.

Time T3

(3) The output of the level shifter K1 having received the precharge generation signal Sp is changed to the ground voltage Vss with a slight delay.

(4) The output of the inverter INV2 having received the output of the level shifter K1 starts to rise toward the power source voltage Vcc.

(5) At the same time, by the electric charge charged in the capacitor Cp receiving the output of the inverter INV2, the voltage of the source/drain of the NMOS transistor NT1 and the source of the PMOS transistor PT1 starts to rise toward Vcc+Vt+α. This Vt+α is set with the value of the capacitor Cp in advance.

(6) At the same time, the output of the level shifter K2 having received the output of the level shifter K1 starts to rise toward Vcc+2Vt+α.

(7) By the rising of the voltage of the source/drain of the NMOS transistor NT1 and the source of the PMOS transistor PT1, the precharge control signal Spc also starts to rise toward Vcc+Vt+α from the power source voltage Vcc.

Time T4

(4) The output of the inverter INV2 reaches the power source voltage Vcc, and the voltage is subsequently maintained.

(5) The voltage of the source/drain of the NMOS transistor NT1 and the source of the PMOS transistor PT1 reaches Vcc+Vt+α, and the voltage is subsequently maintained.

(6) The output of the level shifter K2 having received the output of the level shifter K1 reaches Vcc+2Vt+α with a slight delay from the time T4, and the voltage is subsequently maintained.

(7) The voltage of the precharge control signal Spc reaches Vcc+Vt+α, and the voltage is subsequently maintained.

(8) Since the precharge control signal Spc has risen, the bit line pair BLj (BLj) accelerates equalization to the precharge voltage HVcc.

Time T5

(8) The voltage of the bit line pair BLj (BLj) completes the equalization to the precharge voltage HVcc.

Time T6

(5) In the state of the embodiment 2 of the present invention before the modification, the electric charge charged in the capacitor Cp starts to discharge, and the voltage of the source of the NMOS transistor NT1 and the drain of the PMOS transistor PT1 starts to drop from the voltage Vcc+Vt+α maintained until now. However, in this modified example, the voltage Vcc+Vt+α remains to be maintained.

(7) In the embodiment 2 of the present invention, the precharge control signal Spc starts to drop from the voltage Vcc+Vt+α maintained until now. However, in this modified example, the voltage Vcc+Vt+α remains to be maintained.

[Points to be noted]

When the precharge period becomes long, the electric charge originally charged in the capacitor Cp starts to discharge, and as a result, the level of the precharge control signal drops. However, since it is compensated by the operation power source supplied to the complementary amplifier through the NMOS transistor NT6, falling of the level of the precharge control signal does not occur.

<Effects of the Embodiment 2>

1. By adding the output of the level shifter K1 to the precharge control signal Spc through the NMOS transistor NT6, even if the precharge period becomes long, the level of the precharge control signal Spc can be maintained to the power source voltage Vcc, so that it is possible to prevent the bit line pair BLj (BLj) from being brought into a floating state.

2. When the precharge period becomes long, the electric charge originally charged in the capacitor Cp starts to discharge. However, it becomes possible to compensate the discharge of the capacitor by supplying the output of the level shifter K2 to the complementary amplifier through the NMOS transistor NT6. As a result, even if the precharge period becomes long, the level of the precharge control signal Spc can be maintained to the VBOOST, so that it is possible to prevent the bit line pair BLj (BLj) from being brought into the floating state.

Moreover, even in the state where Vcc is a low voltage not higher than 2Vt, it is possible to prevent the bit line pair from being brought into the floating state.

What is claimed is:

1. A precharge control signal generating circuit in a precharge control circuit of a semiconductor memory, comprising:

a complementary amplifier for receiving a precharge generation signal and outputting a precharge control signal;

an operation power source supplying circuit for supplying an operation power source to the complementary amplifier, the circuit having a first electrode connected to a power source voltage of a device and a second electrode connected to a first electrode of the complementary amplifier;

a level shifter for receiving a part of the precharge generation signal, raising its level to a value higher than the power source voltage of the device by a predetermined value, and transmitting it to the operation power source supplying circuit; and a capacitor for receiving a part of an output of the level shifter, supplying it to the first electrode of the complementary amplifier, and pumping the operation power source of the complementary amplifier by a predetermined value.

2. A precharge control signal generating circuit according to claim 1, further comprising a pulse expansion circuit for expanding a pulse width of the precharge generation signal inputted to the complementary amplifier, wherein a timing when the complementary amplifier is tuned off is made coincident with or delayed from a timing when the operation power source supplying circuit for supplying the operation power source is turn off.

3. A precharge control signal generating circuit according to claim 1, further comprising means for receiving a part of the output of the level shifter, amplifying it, and adding it to the precharge control signal.

4. A precharge control signal generating circuit according to claim 1, further comprising:

a second level shifter for receiving a part of the output of the level shifter and raising its level; and a second operation power source supplying circuit for supplying the operation power source to the complementary amplifier, the circuit having a first electrode connected to a voltage exceeding the predetermined value, and a second electrode connected to the first electrode of the complementary amplifier, whereby a discharged electric charge of the capacitor is compensated.

* * * * *